United States Patent [19]

Asanasavest

[11] Patent Number: 5,494,207

[45] Date of Patent: Feb. 27, 1996

[54] WIRE BONDER TRANSDUCER ARRANGEMENT AND METHOD

[75] Inventor: Chainarong Asanasavest, Penang, Malaysia

[73] Assignee: National Semiconductor Corporation, Santa Clara, Calif.

[21] Appl. No.: 247,044

[22] Filed: May 20, 1994

[51] Int. Cl.$^6$ .................................................. B23K 20/10
[52] U.S. Cl. ........................ 228/110.1; 228/1.1; 228/4.5
[58] Field of Search ......................... 228/1.1, 4.5, 110.1, 228/180.5

[56] References Cited

U.S. PATENT DOCUMENTS

| | | | |
|---|---|---|---|
| 4,437,604 | 3/1984 | Razon et al. | 228/180.5 |
| 4,466,565 | 8/1984 | Miyazima | 228/1.1 |
| 5,364,009 | 11/1994 | Takahashi et al. | 228/180.5 X |

*Primary Examiner*—Kenneth J. Ramsey
*Attorney, Agent, or Firm*—Hickman & Beyer

[57] ABSTRACT

A wire bonder for electrically coupling an integrated circuit die to associated wiring traces is disclosed. In one aspect of the invention, the wire bonder includes a pair of ultrasonic transducers. A capillary holder is connected between the transducers to support a capillary having a bonding wire suitable for electrically connecting an integrated circuit die pad to a lead on an associate wiring trace. A signal generator applies drive signals to the transducers to mechanically bond a bonding wire to at least one of an integrated circuit die pad and a wiring trace. The signal generator is arranged to permit independent actuation of the transducers at frequencies suitable for ultrasonic welding. The signal generator means includes a controller for controlling the timing of the drive signals. With this arrangement, the direction of ultrasonic energy applied during welding may be varied by adjusting the relative timing of actuation of the transducers. In a preferred embodiment, the controller is arranged to adjust the phase of the drive signals supplied to the transducers. In a method aspect of the invention, one end of a bonding wire is ultrasonically bonded to an IC die pad. The other end of the bonding wire is then ultrasonically bonded to the lead of an associated wiring trace. The direction of the ultrasonic energy used for bonding at least one of the ends of the bonding wires is arranged to be non-linear.

19 Claims, 5 Drawing Sheets

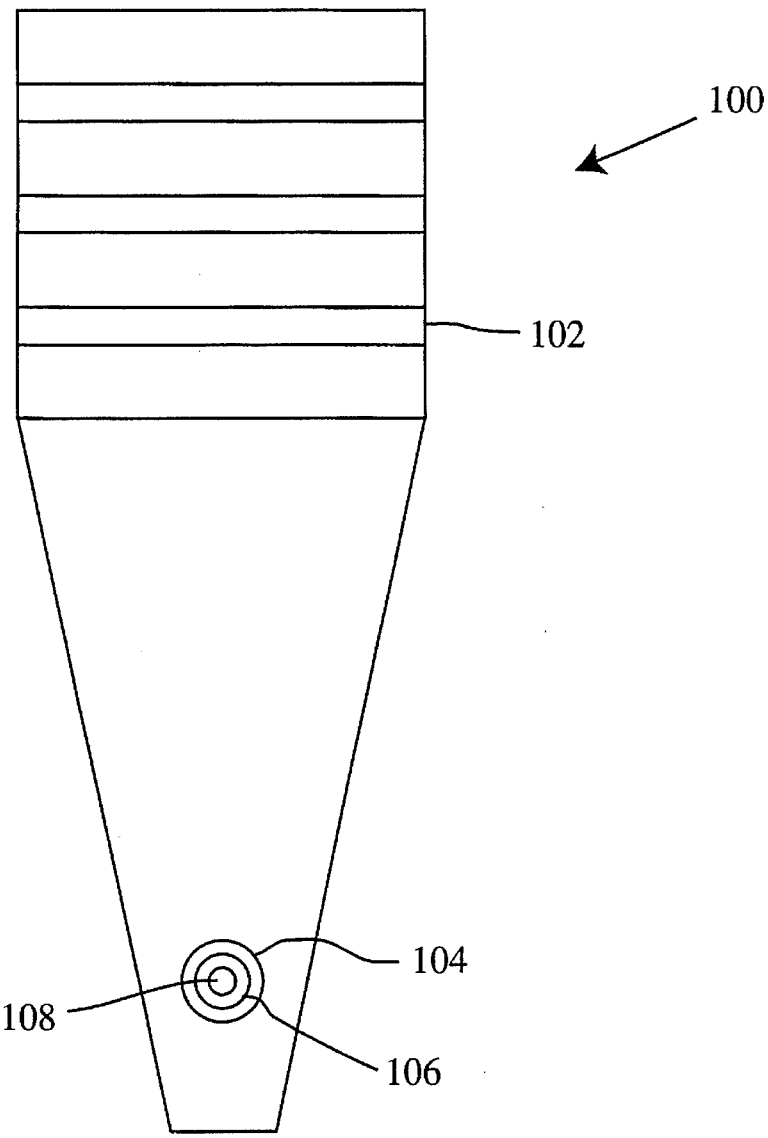
FIG. 1
      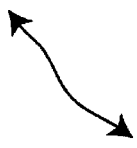   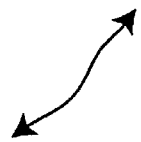
FIG. 4a        FIG. 4b        FIG. 4c        FIG. 4d

WIRE BONDER TRANSDUCER ARRANGEMENT AND METHOD

BACKGROUND OF THE INVENTION

The present invention relates generally to semiconductor package wire bonding. More particularly, an improved method and apparatus for insuring that bonding wires are firmly secured between an integrated circuit die and its associated wiring traces is disclosed.

One of the most popular methods of electrically coupling an integrated circuit to its associated wiring traces during semiconductor packaging is known as wire bonding. In wire bonding, extremely small bonding wires are extended between die pads on the integrated circuits and the leads of the associated wiring traces. The bonding wires are typically ultrasonically welded to their associated contacts. In order to ensure that the integrated circuits are not degraded during the attachment of the bonding wires, it is desirable to conduct the ultrasonic welding at relatively low temperatures. However, the lower the temperature, the more difficult it is to form a bond or weld that sticks well.

Referring initially to FIG. 1, a conventional wire bonder ultrasonic welding transducer arrangement will be schematically described. The transducer 100 has a piezoelectric element 102 and a capillary holder in the form of opening 104. A capillary 106 is firmly secured by the capillary holder by a lock screw (not shown) and is arranged to feed a bonding wire 108 as necessary. Typically, the distal end of the bonding wire is initially ultrasonically bonded to a die pad on an integrated circuit. This is typically accomplished by a process known as ball bonding. When the first end of the bonding wire is firmly adhered to the die pad, the transducer and capillary arrangement is moved to a position over a lead of the die pad's associated trace. As the transducer is moved, the bonding wire is fed through the capillary. The bonding wire is then ultrasonically welded to the associated lead and the continuous feed wire is cut off so that a short and discrete bonding wire is formed between the die pad and the wire trace lead. The ultrasonic welding to the lead is typically done by a process referred to as stitch bonding. One problem that has been discovered, particularly when relatively lower temperatures are used during the welding operation is that welds at certain locations tend to have sticking problems.

The applicant has determined that there is a correlation between the regions which tend to have poor welds and the bonding angle. In one type of experiment, an integrated circuit (IC) die was wire bonded to a lead frame 68 leads. The frame leads were cleaned well to eliminate the risk that contamination significantly detracted from the sticking ability of the bonds. In a reference system in which the direction of vibration of the capillary is considered the Y-axis, it was observed that bonding wires that were attached to the lead frame at angles of ±10–20 degrees from the X-axis tended to have relatively consistent non-sticking problems when compared to bonds formed at different directions. This angle is referred to as the bonding angle herein. That is, leads having bonding angles of ±10–20 degrees tended to exhibit greater non-sticking problems. Accordingly, it is a general objective of the present invention to provide an apparatus and method that facilitates more uniform and efficient ultrasonic bonding and welding in integrated circuit packaging wire bonding applications.

SUMMARY OF THE INVENTION

To achieve the foregoing and other objects and in accordance with the purpose of the present invention, a wire bonder for electrically coupling an integrated circuit die to associated wiring traces is disclosed. In one aspect of the invention, the wire bonder includes a pair of ultrasonic transducers. A capillary holder is connected between the transducers to support a capillary having a bonding wire suitable for electrically connecting an integrated circuit die pad to a lead on an associate wiring trace. A signal generator applies drive signals to the transducers to mechanically bond a bonding wire to at least one of an integrated circuit die pad and a wiring trace. The signal generator is arranged to permit independent actuation of the transducers at frequencies suitable for ultrasonic welding. The signal generator means includes a controller for controlling the timing of the drive signals. With this arrangement, the direction of ultrasonic energy applied during welding may be varied by adjusting the relative timing of actuation of the transducers. In a preferred embodiment, the controller is arranged to adjust the phase of the drive signals supplied to the transducers.

In a method aspect of the invention, one end of a bonding wire is ultrasonically bonded to an IC die pad. The other end of the bonding wire is then ultrasonically bonded to the lead of an associated wiring trace. The direction of the ultrasonic energy used for bonding at least one of the ends of the bonding wires is arranged to be non-linear. In preferred embodiments, the non-linearly applied energy may be respectively used in stitch and ball bonding steps. In another preferred aspect of the invention, a wire bonder having a pair of spaced apart ultrasonic transducers is used for the bonding steps, the transducers are driven with different phased drive signals.

BRIEF DESCRIPTION OF THE DRAWINGS

The invention, together with further objects and advantages thereof, may best be understood by reference to the following description taken in conjunction with the accompanying drawings in which:

FIG. 1 is a diagrammatic illustration of a conventional wire bonder ultrasonic welding transducer arrangement.

FIG. 4a illustrates the direction at which ultrasonic power is applied to the bonding site when the drive signals to the first and second transducers in the wire bonder transducer arrangement of FIG. 3 are 180° out of phase.

FIG. 4b illustrates the direction at which ultrasonic power is applied to the bonding site when the drive signals to the first and second transducers in the wire bonder transducer arrangement of FIG. 3 are in phase.

FIG. 4c illustrates the direction at which ultrasonic power is applied to the bonding site when the drive signals to the first and second transducers are alternatively driven in the wire bonder transducer arrangement of FIG. 3 with the transducer on the left first being driven with a positive signal and the transducer on the right then being driven by a negative signal.

FIG. 4d illustrates the direction at which ultrasonic power is applied to the bonding site when the drive signals to the first and second transducers are alternatively driven in the wire bonder transducer arrangement of FIG. 3 with the transducer on the left first being driven with a negative signal and the transducer on the right then being driven by a positive signal.

DETAILED DESCRIPTION OF THE INVENTION

Figure 2A:
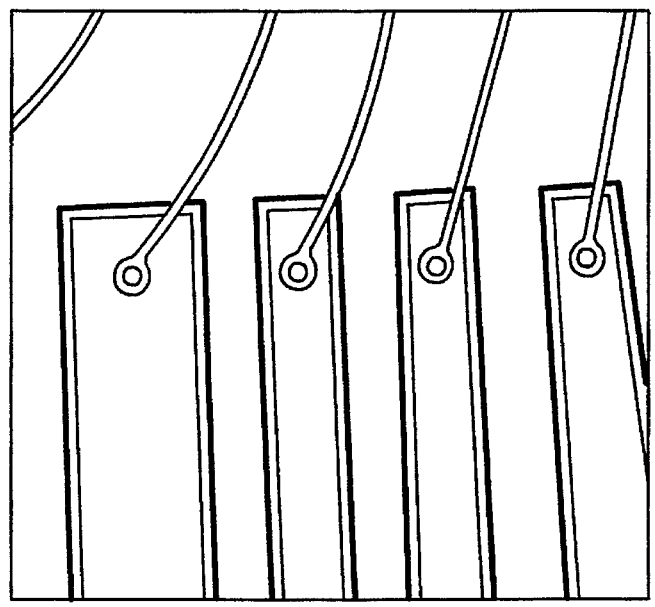
FIG. 2a is a photo showing conventionally formed ultrasonic stitch welds in a region where good bonds are formed.
Figure 2B:
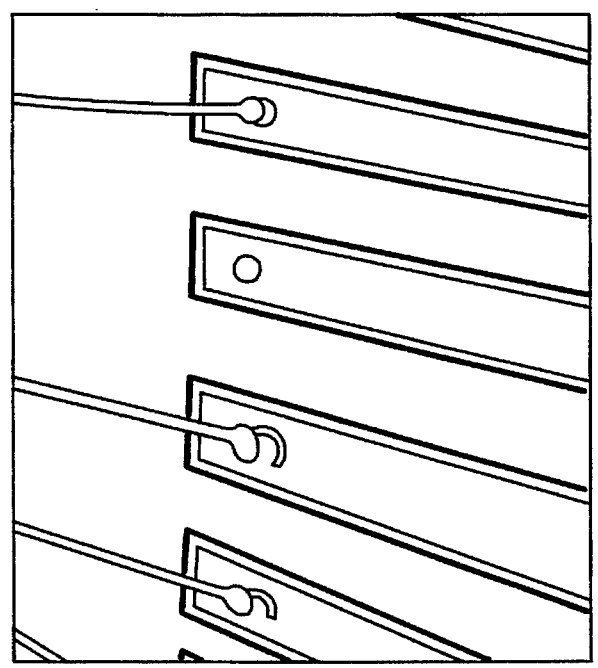
FIG. 2b is a photo showing conventionally formed ultrasonic stitch welds in a region where the bonding angle is in the range of approximately 10°–20°.
Figure 3:
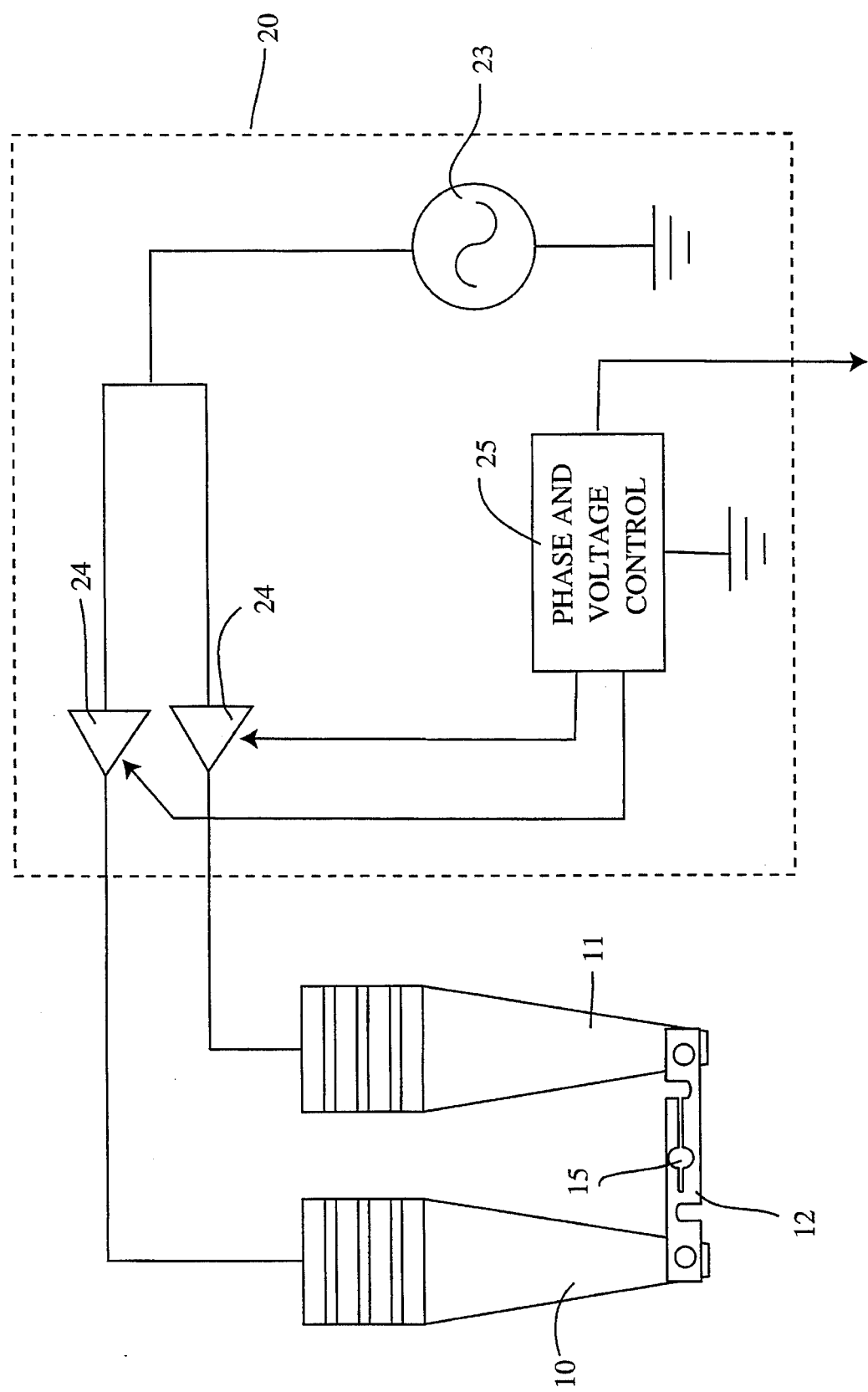
FIG. 3 is a diagrammatic illustration of a wire bonder transducer arrangement in accordance with an embodiment of the present invention.

Referring initially to FIG. 3, a transducer arrangement in accordance with the first embodiment of the present invention will be described. The transducer arrangement includes a pair of conventional ultrasonic welding transducers 10, 11, a capillary holder 12 suitable for supporting a capillary 15, and a drive signal generator 20. Conventional wire bonder transducers may be used as transducers 10, 11. By way of example, KNS 1484 wire bonder piezoelectric transducers, available from Kulick and Soffar Industries, Inc. work well. These transducers 10, 11 are aligned and coupled together by capillary holder 12. The capillary holder 12 is designed to hold the transducers a fixed distance apart. The transducers 10, 11 are independently driven by a signal generator 20. When activated, the transducers tend to vibrate in a relatively consistent manner and when activated at suitable frequencies, the motion of each transducer is substantially linear in nature. Movement of the transducers translates to movement of the capillary holder and thus the capillaries. The capillaries in turn apply the force to the bonding wire during welding.

The signal generator may include an oscillator 23, a pair of power amplifiers 24 and a signal controller 25. The oscillator 23 provides a base drive signal whose phase and amplitude is controlled by the power amplifiers and signal controller. A wide variety of drive signals may be used depending primarily on the type of transducer used. By way of example, a sinusoidal drive signal in the ultrasonic range works well. Of course, the waveform of the drive signal may vary widely in accordance with the needs of a particular system. The phase and amplitude of the respective drive signals are controlled by signal controller 25. As will be described below with reference to FIGS. 4a–4d, manipulation of the relative phases of the drive signals applied to the transducers 10 and 11 control the direction at which ultrasonic power is applied to the bonding and welding sites. Typically the amplitudes of vibration will be regulated to be the same, although it would be possible to vary the amplitudes as well. As will be appreciated by those skilled in the art, the power amplifiers 24 should be designed to match the input impedance of the transducers to ensure accuracy of the phase control.

Figure 5:
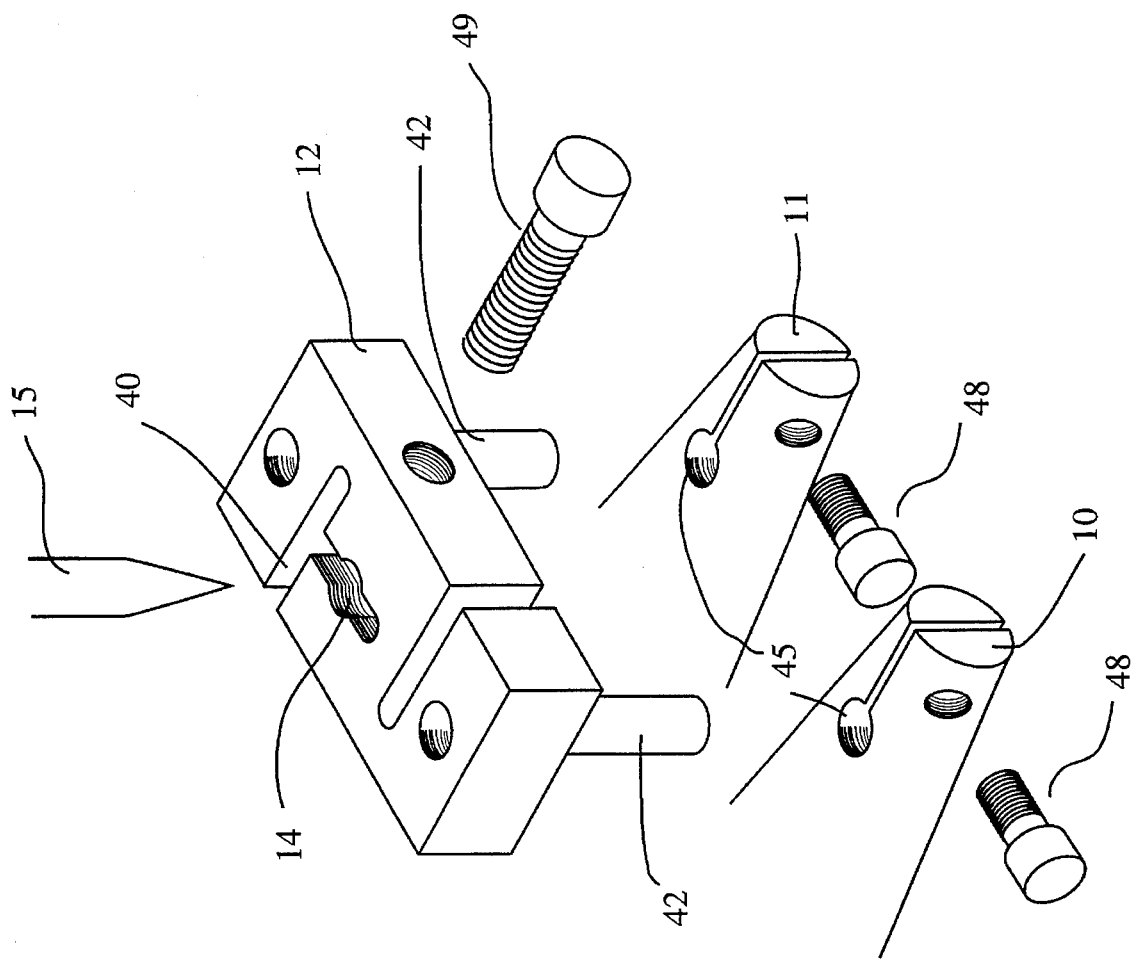
FIG. 5 is an exploded perspective view of the capillary holder shown in FIG. 3.

Referring next to FIG. 5, the capillary holder 12 includes a central opening 14 located midway between the transducers. The central opening 14 receives the capillary 15 which is thus supported at the midpoint of the capillary holder. The central opening 14 is formed and sized in a conventional manner to receive a capillary 15. A pair of slots 40 are provided to reduce the energy losses created by friction internal to the capillary holder. The slots also permit slight deformation of the capillary holder during use, particularly when the transducers are operated in opposite directions and/or one transducer is fixed while the other is actuated. A pair of pegs 42 extend from one surface of the capillary holder 12 to facilitate coupling the capillary holder to the transducers. The pegs 42 are sized similarly to the capillary 15 so that they fit well in the capillary supporting openings 45 in the transducers 10 and 11. The pegs 42 may be secured to their respective transducers in the same manner as the capillary would normally be attached. In the embodiment shown, this is accomplished through the use of lock screws 48. Similarly, a lock screw 49 is used to secure the capillary 15 in the capillary holder 12.

In the described embodiment, the motion of the transducer is relatively linear. Thus, referring initially to FIG. 4a, an oscillatory rotational type movement can be created by activating a first one of the transducers 180° out of phase with the other. With this arrangement, transducers 10 and 11 move in substantially opposite directions, which causes the capillary to pivot back and forth. A more linear type of movement can be created by activating the transducers in phase as represented by FIG. 4b. If a positive signal is initially supplied to transducer 10 and a negative signal is then sequentially supplied to transducer 11, a more complex movement is created as represented by FIG. 4c. A reverse motion can be created by initially supplying a negative signal to transducer 10 and then sequentially a positive signal to transducer 11 as represented by FIG. 4d. It should be appreciated that a wide variety of different motions can be created by altering the phase of the signals supplied to the respective transducers.

Figure 6:
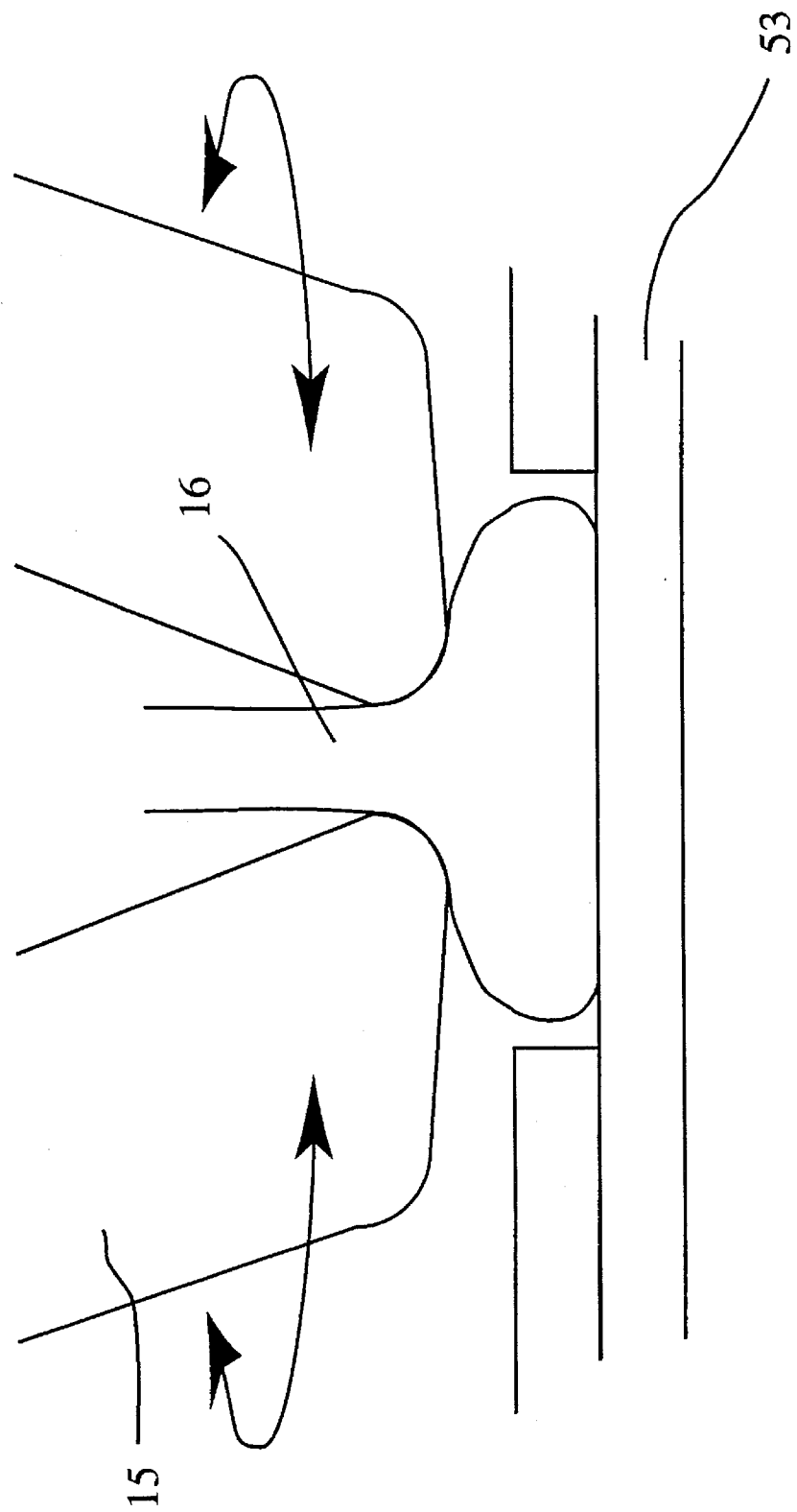
FIG. 6 is an enlarged diagrammatic view of a capillary tip forming a ball bond on an IC die pad.

The different types of motion may be appropriate for different types of bonds. For example, in ball bonding, a rotational motion such as that shown and described with reference to FIG. 4a works particularly well. In many conventional wire bonding processes, a first end of the bonding wire is ball bonded to the die pad on the integrated circuit die. Use of rotational motion during this ultrasonic bonding step permits the welding to be done at lower temperatures. The reason is that the rotational scrubbing directly transfers ultrasonic energy to the ball bond more efficiently than conventional ultrasonic ball bonding welding techniques. It is believed that temperatures below 100° C. and possibly as low as 25° C. (room temperature) are feasible when ball bonding gold wire using such a rotational force. The capillary wire material most commonly used for bonding wires is gold. Of course the invention can be used in conjunction with the ultrasonic bonding of silver and other bonding wire materials as well. FIG. 6 illustrates a capillary 15 in the process of ball bonding a first end of a bonding wire 16 to a bond pad 53 in an integrated circuit die.

The second end of the bonding wire is commonly stitch bonded to the lead traces. The lead traces may be leads of a lead frame, printed circuit wiring or other suitable leads. It is the problems with the sticking of stitch bonds of wires oriented in certain directions that is described in the background section of the invention. By varying the direction of the energy applied when forming the stitch bonds, the non-sticking problems can be greatly reduced. Thus, varying the direction of the energy applied to various stitch bonds is believed to improve the bonding generally, which again facilitates bonding at lower temperatures. By way of example, the multi-directional scrubbing motions shown in FIGS. 4c and 4d are more efficient than conventional bonds, although of course a wide variety of other welding patterns could be used as well. This improved bonding is beneficial in several respects. Initially, lower temperature bonding is inherently somewhat less expensive in and of itself. However, more importantly, it permits the integrated circuits themselves to be designed without requiring that they withstand relatively higher temperatures during bonding without degrading the IC. This permits further (often more significant) cost savings because of higher yields.

Although only one embodiment of the present invention has been described in detail, it should be understood that the present invention may be embodied in many other specific forms without departing from the spirit or scope of the invention. Particularly, the described device may be used in conjunction with a wide variety of wire bonding processes, in addition to the ball bonding/stitch bonding process used in the example. Further, the described transducer has a relatively linear movement, which translates to relatively linear movement of the capillary. However, the invention is not limited to use with transducers that have primarily linear movements. It may be used in conjunction with a wide variety of transducers to improve their bond strength.

The invention has been described in conjunction with an example wherein the bonding wire is ball bonded to a die pad and stitch bonded to a lead trace. It should be appreciated that the same types of improvement would be found when ball bonding a bonding wire to a lead trace and/or stitch bonding a bonding wire to a die pad. Similarly, the invention can be used when wire bonding a pair of integrated circuit dies together. Additionally, a particular capillary holder structure and a particular signal generator arrangement have been described. However, the actual construction of these devices may be varied widely. Therefore, the present examples are to be considered as illustrative and not restrictive, and the invention is not to be limited to the details given herein, but may be modified within the scope of the appended claims.

I claim:

1. A wire bonder for electrically coupling an integrated circuit die to associated wiring traces, the wire bonder comprising:

first and second ultrasonic transducers that are aligned substantially in parallel;

a capillary holder for supporting a capillary having a bonding wire suitable for electrically connecting an integrated circuit die pad to a lead on an associate wiring trace, the capillary holder being secured to the first and second transducers such that actuation of either of said transducers will cause movement of the capillary supported by the capillary holder; and signal generator means for applying drive signals to the transducers to mechanically bond a bonding wire to at least one of an integrated circuit die pad and a wiring trace, the signal generator means being arranged to permit independent actuation of the transducers at frequencies suitable for ultrasonic welding, the signal generator means including a controller for controlling the timing of the drive signals whereby the direction of ultrasonic energy applied during welding may be varied by adjusting the relative timing of actuation of the first and second transducers.

2. A wire bonder as recited in claim 1 wherein the associated wiring traces take the form of a lead frame in a semiconductor package.

3. A wire bonder as recited in claim 1 wherein the associated wiring traces take the form of a tape lead in a tape automated bonding semiconductor package.

4. A wire bonder as recited in claim 1 wherein the associated wiring trace leads take the form of die pads on a second integrated circuit die.

5. A wire bonder as recited in claim 1 further comprising a capillary that feeds the bonding wire therethrough, the capillary being supported by the capillary holder at a position that is apart from and between the first and second transducers.

6. A wire bonder as recited in claim 1 wherein the signal generator means includes a pair of discrete signal generators, each signal generator being arranged to apply a drive signal to a corresponding one of the transducers.

7. A wire bonder for electrically coupling an integrated circuit die to associated wiring traces, the wire bonder comprising:

first and second ultrasonic transducers;

a capillary holder for supporting a capillary having a bonding wire suitable for electrically connecting an integrated circuit die pad to a lead on an associate wiring trace, the capillary holder being secured to the first and second transducers such that actuation of either of said transducers will cause movement of the capillary supported by the capillary holder; and signal generator means for applying drive signals to the transducers to mechanically bond a bonding wire to at least one of an integrated circuit die pad and a wiring trace, the signal generator means being arranged to permit independent actuation of the transducers at frequencies suitable for ultrasonic welding, the signal generator means including a controller for controlling the timing of the drive signals whereby the direction of ultrasonic energy applied during welding may be varied by adjusting the relative timing of actuation of the first and second transducers, wherein the drive signals transmitted to the first and second transducers are derived from a common source and the controller is arranged to adjust the phase of the drive signals.

8. A wire bonder as recited in claim 1 wherein the controller is further arranged to adjust the amplitude of the drive signals.

9. A wire bonder as recited in claim 1 wherein the transducers are piezoelectric transducers.

10. A wire bonder for electrically coupling an integrated circuit die to associated wiring traces in a semiconductor package, the wire bonder comprising:

a transducer arrangement;

a capillary holder for supporting a bonding wire suitable for electrically connecting an integrated circuit die pad to a lead on an associate wiring trace, the capillary holder being secured to the transducer arrangement such that actuation of the transducer arrangement will cause movement of the capillary holder; and a signal generator for applying drive signals to the transducers at frequencies suitable for ultrasonic welding to ultrasonically weld a bonding wire between an integrated circuit die pad and a wiring trace lead, the signal generator being arranged to permit actuation of the transducer arrangement in a manner that permits non-linear variation of the direction of ultrasonic energy applied during welding of different bonding wires in a semiconductor package to provide good welds between the bonding wires and their associated wiring traces.

11. A method of wire bonding an integrated circuit to leads of associated wiring traces, the method comprising the steps of:

(a) ultrasonically bonding a first end of a first bonding wire to a first die pad on the integrated circuit; and (b) ultrasonically bonding a second end of the first bonding wire to a first lead trace, wherein the direction of the ultrasonic energy used for ultrasonically bonding at least one of the ends of the bonding wire is non-linear.

12. A method as recited in claim 11 wherein the direction of the ultrasonic energy used for ultrasonically bonding the second end of the first bonding wire to the first lead trace is non-linear.

13. A method as recited in claim 11 wherein a wire bonder having a pair of spaced apart ultrasonic transducers is used for said bonding steps, the method further comprising the step of driving said transducers with different phased drive signals during the non-linear ultrasonically bonding step.

14. A method as recited in claim 11 wherein the direction of the ultrasonic energy used for bonding the first end of the first bonding wire includes a rotational component.

15. A method as recited in claim 14 wherein the direction of the ultrasonic energy used for said first end bonding step is substantially rotational.

16. A method as recited in claim 11 further comprising the steps of repeating said steps (a) and (b) as necessary to electrically connect additional die pads on the integrated circuit to their associated wiring traces.

17. A method of wire bonding an integrated circuit to leads of associated wiring traces, the method comprising the steps of:

bonding a first end of a first bonding wire to a first die pad;

ultrasonically welding a second end of the first bonding wire to a lead of an associated first trace, the direction of the ultrasonic energy used for welding the second end of the first bonding wire to the lead of the associated first trace defining a first pattern;

bonding a first end of a second bonding wire to a second die pad; and ultrasonically welding a second end of the second bonding wire to a lead of an associated second trace, the direction of the ultrasonic energy used for welding the second end of the second bonding wire to the lead of the associated second trace defining a second pattern that is non-linear and varies in direction from said first pattern.

18. A method as recited in claim 17 wherein a wire bonder having a pair of spaced apart ultrasonic transducer is used for said bonding and welding steps, and wherein at least one of the timing and phase of drive signals that drive the transducers is varied between the welding steps for the first and second bonding wires to vary the welding patterns.

19. A method of wire bonding a first component to a second component, the method comprising the steps of:

(a) ultrasonically bonding a first end of a first bonding wire to the first component; and (b) ultrasonically bonding a second end of the first bonding wire to the second component, wherein the direction of the ultrasonic energy used for bonding at least one of the ends of the bonding wire is non-linear.

* * * * *